United States Patent [19]

Ikemasu

[11] Patent Number: 5,140,392
[45] Date of Patent: Aug. 18, 1992

[54] HIGH VOLTAGE MOS TRANSISTOR AND PRODUCTION METHOD THEREOF, AND SEMICONDUCTOR DEVICE HAVING HIGH VOLTAGE MOS TRANSISTOR AND PRODUCTION METHOD THEREOF

[75] Inventor: Shinichirou Ikemasu, Kawasaki, Japan

[73] Assignee: Fujitsu Limited, Kawasaki, Japan

[21] Appl. No.: 665,236

[22] Filed: Mar. 5, 1991

[30] Foreign Application Priority Data

Mar. 5, 1990 [JP] Japan ................................. 2-54521

[51] Int. Cl.$^5$ ........................................... H01L 29/78
[52] U.S. Cl. ................................. 357/23.8; 357/59
[58] Field of Search ...................... 357/23.8, 59 K

[56] References Cited

U.S. PATENT DOCUMENTS

| | | | |
|---|---|---|---|
| 4,546,366 | 10/1985 | Buchanan | 357/59 K |
| 4,949,136 | 8/1990 | Jain | 357/23.8 |

FOREIGN PATENT DOCUMENTS

| | | |
|---|---|---|
| 0068897 | 1/1983 | European Pat. Off. . |
| 0104754 | 4/1984 | European Pat. Off. . |
| 0248292 | 12/1987 | European Pat. Off. . |
| 2816271 | 11/1978 | Fed. Rep. of Germany . |
| 92471 | 4/1987 | Japan . |
| 2011178 | 7/1979 | United Kingdom . |

*Primary Examiner*—James W. Davie
*Attorney, Agent, or Firm*—Staas & Halsey

[57] ABSTRACT

A high voltage MOS transistor includes a semiconductor substrate (1) of a first semiconductor type, a gate electrode (14) formed on the semiconductor substrate via a gate oxide layer (13), first and second diffusion regions (15, 16) formed in the semiconductor substrate on both sides of the gate electrode and being of a second semiconductor type opposite to the first semiconductor type, and an electrode (38) which is directly connected to the first diffusion region (15) and is made up of a conductor layer (49) including polysilicon. An impurity concentration of the conductor layer (49) including the polysilicon is higher than an impurity concentration of the first diffusion region (15).

26 Claims, 16 Drawing Sheets

HIGH VOLTAGE MOS TRANSISTOR AND PRODUCTION METHOD THEREOF, AND SEMICONDUCTOR DEVICE HAVING HIGH VOLTAGE MOS TRANSISTOR AND PRODUCTION METHOD THEREOF

BACKGROUND OF THE INVENTION

The present invention generally relates to metal oxide semiconductor (MOS) transistors and methods of producing such MOS transistors, and semiconductor devices having a high voltage MOS transistor and methods of producing such semiconductor devices. More particularly, the present invention relates to a high voltage MOS transistor which is suited for use in a boost part of a dynamic random access memory (DRAM), for example, a method of producing such a high voltage MOS transistor, a semiconductor device having such a high voltage MOS transistor, and a method of producing such a semiconductor device.

In DRAMs, the voltage applied to a word line is generally boosted to a voltage greater than or equal to the power source voltage in order to apply a sufficiently high voltage to a capacitor of a memory cell and positively write data. FIG. 1 shows an example of a bootstrap word line driver circuit for applying the boosted voltage to the word line. As shown, first and second n-type MOS transistors 551 and 552 are connected in series, and a drain d3 of a third n-type MOS transistor 553 is connected to a gate g1 of the transistor 551 at a node A.

A boost voltage Vo from a voltage boost circuit (not shown) is applied to a drain d1 of the transistor 551 via a terminal 555. A power source voltage Vcc from a power source (not shown) is applied to a gate g3 of the transistor 553 via a terminal 556. An output signal of a decoder (not shown) is applied to a source s3 of the transistor 553 via a terminal 557. The source s3 and the terminal 557 are connected at a node B. A gate g2 of the transistor 552 is coupled to a reset signal line RL via a terminal 558. A source s1 of the transistor 551 and a drain d2 of the transistor 552 are connected at a node D, and the node D is coupled to a word line WL via a terminal 559. A source s2 of the transistor 552 is grounded.

When the transistor 553 is selected by the output signal of the decoder and is turned ON, the potential at the source s3 (node B) becomes Vcc. The potential at the drain d3 (node A) becomes Vcc-Vth, where Vth denotes a threshold voltage of the transistor 553. Accordingly, the transistor 551 turns ON, the transistor 553 turns OFF and the drain d3 assumes a floating state. Since the potential at the node A is Vr which is raised greater than or equal to the boost voltage Vo due to the gate capacitance coupling of the transistor 551, the boost voltage Vo at the node D is applied to the word line WL without a voltage drop. For example, Vcc=5 V, Vo=7.5 V, and Vr=14 V.

Because the power source voltage Vcc is boosted to Vr and applied to the drain d3 of the transistor 553, a diffusion layer which forms the drain d3 must have a sufficiently high withstand voltage. If the diffusion layer forming the drain d3 does not have a sufficiently high withstand voltage, the potential at the node A gradually falls and it becomes impossible to maintain the voltage applied to the word line WL at Vo.

As a method of preventing the voltage drop at the node A, it is conceivable to make a gate oxide layer of the transistor 553 thick. However, this method would go against the recent trend which is to make the gate oxide layer thin in order to reduce the size of the semiconductor device.

FIG. 2 shows an example of a conventional high voltage MOS transistor having a lightly doped drain (LDD) structure. The drain d3 of the transistor 553 is formed by a wide n-type layer 553d which has a relatively low impurity concentration, and the high withstand voltage is realized by increasing a depletion layer which is formed at a junction interface between the n-type layer 553d and a p-type semiconductor substrate 600. In addition, because a drain electrode 601 is normally made of aluminum (Al), the drain d3 is made of an n+-type layer 553e having a relatively high concentration at a portion where the drain d3 connects to the drain electrode 601 so as to prevent the contact resistance from becoming high. In FIG. 2, the MOS transistor also includes a field oxide layer 602, a gate oxide layer 603 and a boron phosphosilicate glass (BPSG) interlayer insulator layer 604.

There roughly are two methods of producing the conventional high voltage MOS transistor. According to a first method, a contact hole for the drain electrode 601 is formed with respect to the n+-type layer 553e which is formed in advance. On the other hand, according to a second method, an ion implantation is made via a contact hole for the drain electrode 601 so as to form the n+-type layer 553e in a selfalign manner.

The first method described above will now be described with reference to FIG. 3. In FIG. 3, $L_1$ denotes a distance between the gate g3 and the n+-type layer 553e, $L_2$ denotes a distance by which the BPSG interlayer insulator layer 604 and the n+-type layer 53e overlap, and $L_3$ denotes a distance corresponding to a width of the contact hole for the drain electrode 601. The withstand voltage of the drain d3 is determined by the distance $L_1$. However, the contact resistance becomes too large if the n-type layer 553d makes direct contact with the Al drain electrode 601 and the n+-type layer 553e must be provided to make contact with the drain electrode 601. For this reason, there is a limit to reducing the distance $L_3$ for making the contact. In addition, the drain electrode 601 may make direct contact with the n-type layer 553d if the contact hole is not formed with the margin corresponding to the distance $L_2$, and there is a limit to reducing the distance $L_2$. Accordingly, the element spreads laterally by the distance $L_1+L_2+L_3$ in order to ensure the withstand voltage of the drain d3 which is determined by the distance $L_1$. In other words, there is a limit to reducing the area occupied by the high voltage MOS transistor.

Next, a description will be given of the second method described above, by referring to FIGS. 4A through 4C. FIG. 4A shows a state where the contact hole is formed in the BPSG interlayer insulator layer 604 and the gate oxide layer 603. FIG. 4B shows a process of forming a resist layer 605 and thereafter carrying out an ion implantation to form the n+-type layer 553e and an n+-type layer 553s which forms the source s3. When carrying out the ion implantation, the impurity ions are also injected at portions indicated by "x" marks due to the positioning margin of the resist layer 605. For this reason, when a process using an HF system etchant is carried out before a process of forming an Al layer which forms the drain electrode 601, stepped portions 610 are formed as shown in FIG. 4C because the portions injected with the impurity ions have a faster etching rate compared to other portions. When the stepped portions 610 are formed, an interconnection layer and the like which are formed thereafter may easily be damaged, and an open circuit may occur in the case of the interconnection layer. This second method forms the n+-type layer 553e in the selfalign manner, and thus, the distance $L_2$ can be reduced when compared to the first method. However, there is a limit to reducing the area occupied by the high voltage MOS transistor because the distance $L_1+L_2+L_3$ is still required. Further, the number of processes required in the second method is larger when compared to that required in the first method.

SUMMARY OF THE INVENTION

Accordingly, it is a general object of the present invention to provide a novel and useful high voltage MOS transistor, a method of producing the high voltage MOS transistor, a semiconductor device having the high voltage MOS transistor and a method of producing the semiconductor device, in which the problems described above are eliminated.

Another and more specific object of the present invention is to provide a high voltage MOS transistor comprising a semiconductor substrate of a first semiconductor type, a gate electrode formed on the semiconductor substrate via a gate oxide layer, first and second diffusion regions formed in the semiconductor substrate on both sides of the gate electrode and being of a second semiconductor type opposite to the first semiconductor type, and an electrode which is directly connected to the first diffusion region and is made up of a conductor layer including polysilicon, where an impurity concentration of the conductor layer including the polysilicon is higher than an impurity concentration of the first diffusion region. According to the high voltage MOS transistor of the present invention, the drain/source region of the relatively low impurity concentration makes direct contact with the drain/source electrode, and thus, it is possible to reduce the size of the high voltage MOS transistor. In addition, since the doped polysilicon is used for the drain/source electrode, it is possible to prevent the contact resistance between the drain/source region and the drain/source electrode from increasing and also realize a high withstand voltage.

Still another object of the present invention is to provide a method of producing a high voltage MOS transistor comprising the steps of selectively forming a field oxide layer on a semiconductor substrate of a first semiconductor type, successively forming a gate oxide layer and a gate electrode on a region of the semiconductor substrate defined by the field oxide layer, forming first and second impurity regions of a second semiconductor type opposite to the first semiconductor type in the semiconductor substrate on both sides of the gate electrode by a first ion implantation, covering the first impurity region by a mask layer, increasing an impurity concentration of the second impurity region higher than an impurity concentration of the first impurity region by a second ion implantation using the field oxide layer, the gate electrode and the mask layer as masks, and forming a conductor layer directly on at least the first impurity region so as to form an electrode, where the conductor layer includes polysilicon with an impurity concentration higher than that of the first impurity region.

A further object of the present invention is to provide a semiconductor device having a high voltage MOS transistor which includes a semiconductor substrate of a first semiconductor type, a gate electrode formed on the semiconductor substrate via a gate oxide layer, first and second diffusion regions of a second semiconductor type opposite to the first semiconductor type formed in the semiconductor substrate on both sides of the gate electrode, a first electrode formed on the first diffusion region, and a second electrode formed on the second diffusion region, where the first diffusion region has an impurity concentration lower than that of the second diffusion region, the first electrode is made of a conductor layer including polysilicon with an impurity concentration higher than that of the first diffusion region, and a voltage applied to the first electrode is greater than a voltage applied to the second electrode.

Another object of the present invention is to provide a method of producing a semiconductor device having at least a high voltage MOS transistor and a MOS transistor which forms a memory cell formed on a semiconductor substrate which is of a first semiconductor type, the method comprising the steps of selectively forming a field oxide layer on the semiconductor substrate, successively forming gate oxide layers and gate electrodes on the semiconductor substrate in regions defined by the field oxide layer, forming impurity regions of a second impurity type, opposite to the first impurity type, in the semiconductor substrate on both sides of the gate electrodes by a first ion implantation, covering the impurity regions of the MOS transistor forming the memory cell and a first impurity region of the high voltage MOS transistor by a mask layer, increasing an impurity concentration of a second impurity region of the high voltage MOS transistor higher than an impurity concentration of the first impurity region by a second ion implantation using the field oxide layer, the gate electrode of the high voltage MOS transistor and the mask layer as masks, and forming a conductor layer directly on at least the first impurity region so as to form an electrode, where the conductor layer includes polysilicon with an impurity concentration higher than that of the first impurity region.

Other objects and further features of the present invention will be apparent from the following detailed description when read in conjunction with the accompanying drawings.

DESCRIPTION OF THE PREFERRED EMBODIMENTS

Figure 5:
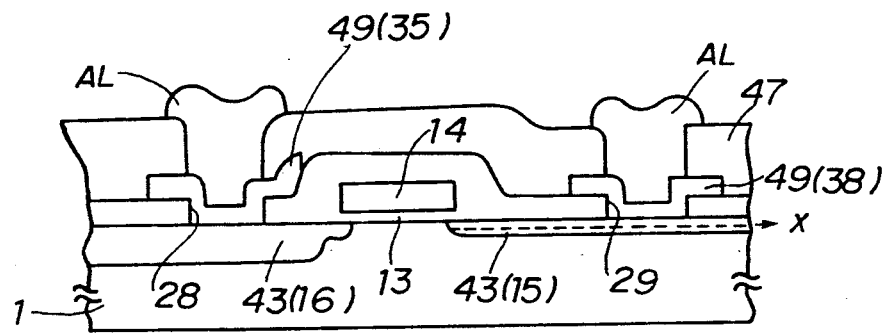
FIG. 5 is a cross-sectional view for explaining an operating principle of a high voltage MOS transistor according to the present invention.

First, a description will be given of an operating principle of a high voltage MOS transistor according to the present invention, by referring to FIG. 5. The high voltage MOS transistor shown in FIG. 5 includes a semiconductor substrate 1 of a first semiconductor type, a gate oxide layer 13, a gate electrode 14, a drain/source region 15 which is made of a second semiconductor type with a relatively low impurity concentration, a source/drain region 16 of a second semiconductor type with a relatively high impurity concentration, a contact hole 28 for a source/drain electrode, a contact hole 29 for a drain/source electrode, a source/drain electrode 35, a drain/source electrode 38, and an interlayer insulator layer 47. The source/drain electrode 35 and the drain/source electrode 38 are formed by a second semiconductor type conductor layer 49 which includes polysilicon and has an impurity concentration which is higher than that of the source/drain region 16. The first and second semiconductor types are mutually opposite semiconductor types, and for example, the first semiconductor type is the p-type and the second semiconductor type is the n-type.

The drain/source of the MOS transistor is formed solely of the drain/source region 15 which is made of the second semiconductor type with the relatively low impurity concentration. The drain/source electrode 38 makes direct contact with the drain/source region 15, and not indirectly via a region of the second conductor type with a relatively high impurity concentration. For this reason, the distance $L_2$ which is required according to the conventional methods described above may be eliminated in the present invention, thereby making it possible to further reduce the size of the MOS transistor.

The drain/source electrode 38 connects directly to the drain/source region 15 which is made of the second semiconductor type with the relatively low impurity concentration. However, the drain/source electrode 38 is not made of Al, but is made of the second semiconductor type conductor layer 49 which includes polysilicon. Hence, the contact resistance does not become large at the part where the drain/source electrode 38 makes contact with the drain/source region 15. In addition, because the drain/source region 15 is thin, the spike of Al becomes a problem if an Al electrode were formed directly on the drain/source region 15, but the problem of the Al spike will not occur in the present invention because the drain/source electrode 38 does not use Al.

Furthermore, compared to the contact between Al and silicon (Si), the contact between polysilicon and Si can be made at a lower impurity concentration. Since the withstand voltage of the transistor is larger for smaller impurity concentrations, the present invention can more easily increase the withstand voltage of the transistor compared to the conventional transistors.

When the drain/source electrode 38 is made of the second semiconductor type conductor layer 49 including polysilicon, the impurities within the conductor layer 49 diffus into the drain/source region 15 to a shallow depth due to solid phase diffusion because it is sufficient for the drain/source region 38 to have the relatively low impurity concentration from the view point of contact resistance. In addition, it is possible to realize a withstand voltage which is higher than that obtainable in the conventional transistors, because a boundary between the drain/source region 15 having the relatively low impurity concentration and the shallow portion having the slightly higher impurity concentration caused by the solid phase diffusion is gradual.

Figure 1:
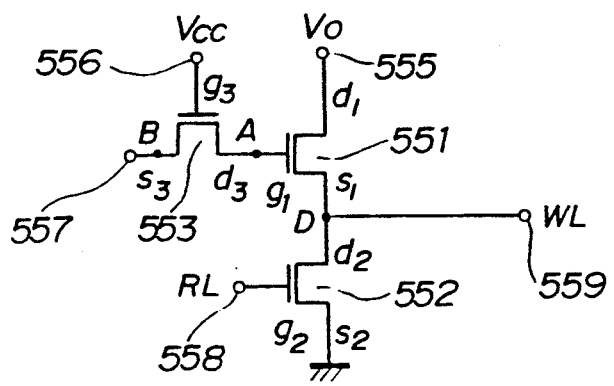
FIG. 1 is a circuit diagram of an example of a bootstrap word line driver circuit.
Figure 2:
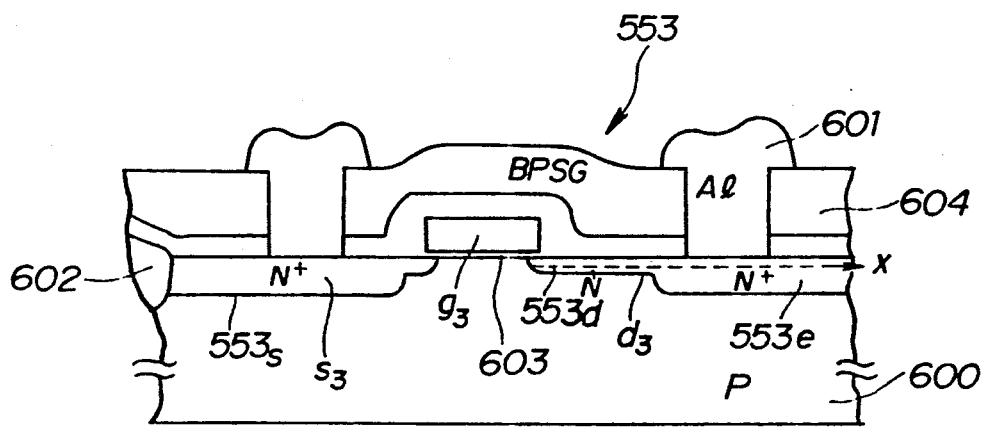
FIG. 2 is a cross sectional view of an example of a conventional high voltage MOS transistor having a LDD structure.
Figure 3:
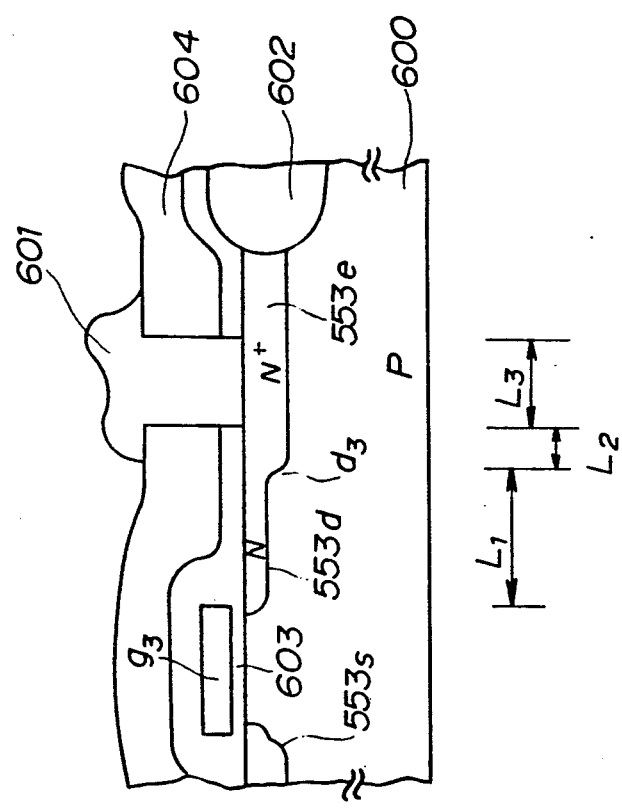
FIG. 3 is a cross-sectional view for explaining a first conventional method of producing the high voltage MOS transistor.
Figure 4A:
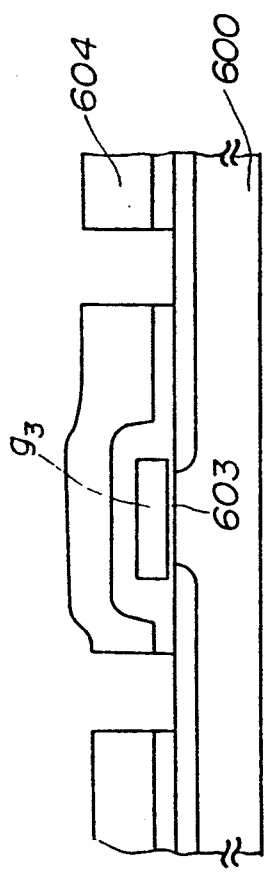
FIGS. 4A, 4B nd 4C are cross-sectional views for explaining a second conventional method of producing the high voltage MOS transistor.
Figure 4B:
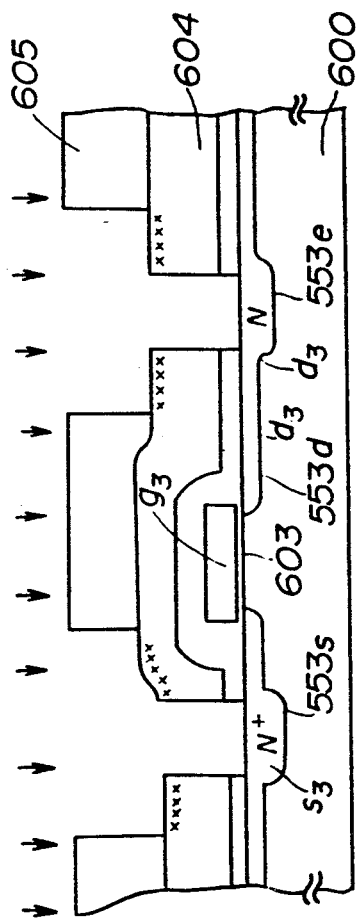
Figure 4C:
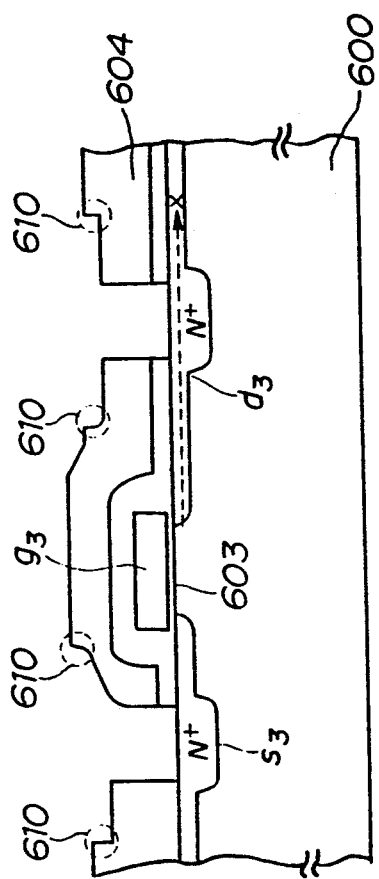
Figure 6:
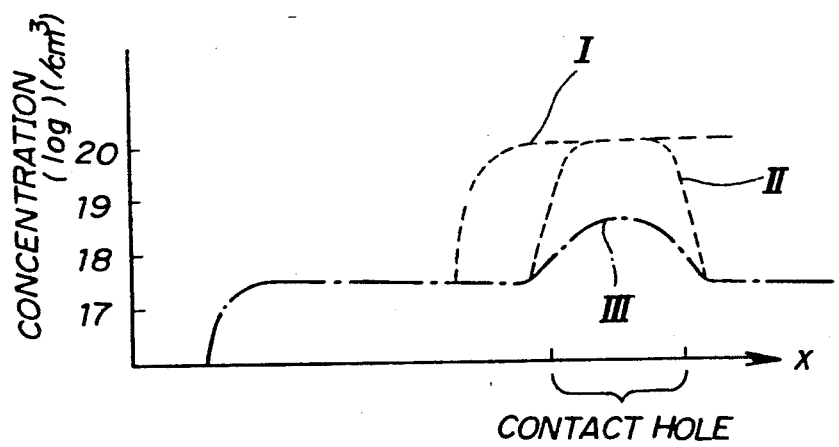
FIG. 6 is a diagram comparing a characteristic of the high voltage MOS transistor according to the present invention with characteristics of the conventional high voltage MOS transistors produced by first and second conventional methods.

FIG. 6 shows the characteristic of the high voltage MOS transistor according to the present invention in comparison with the characteristics of the conventional high voltage MOS transistors which are produced by the first and second methods. In FIG. 6, the ordinate indicates the impurity concentration in a log scale, and the abscissa indicates a direction x in FIGS. 2, 4C and 5. Dotted lines I and II respectively indicate the characteristics of the high voltage MOS transistors produced by the first and second methods, and a one-dot chain line III indicates the characteristic of the high voltage MOS transistor according to the present invention.

Figure 7A:
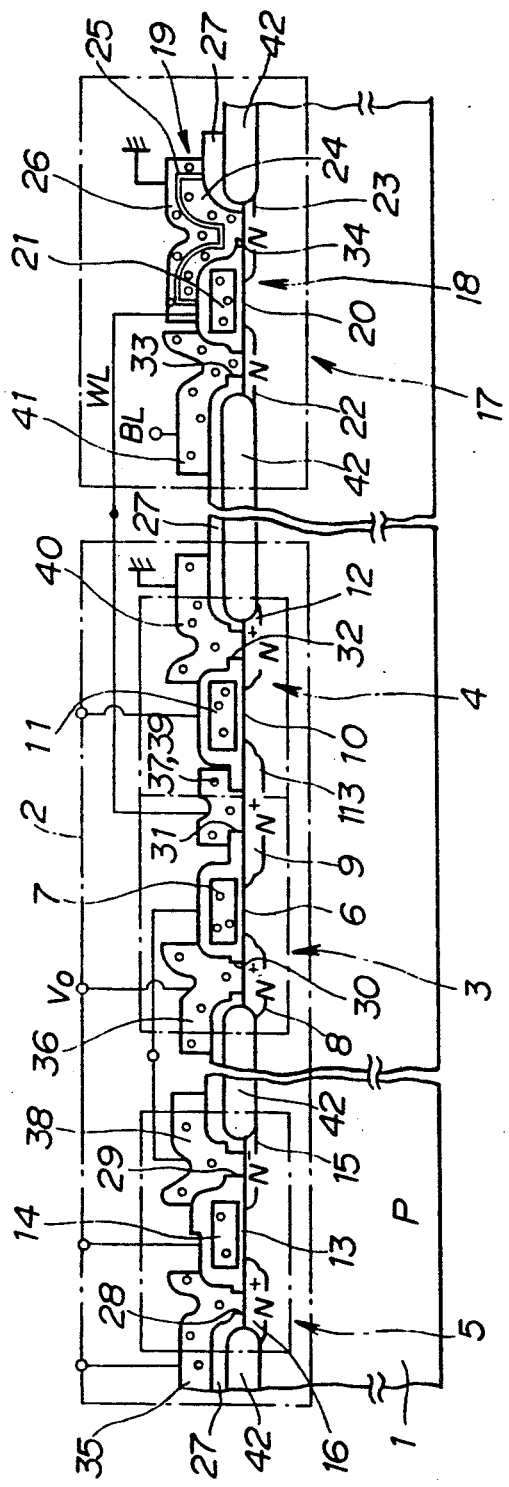
FIGS. 7A and 7B respectively are a cross-sectional view and a circuit diagram of a first embodiment of a semiconductor device according to the present invention.
Figure 7B:
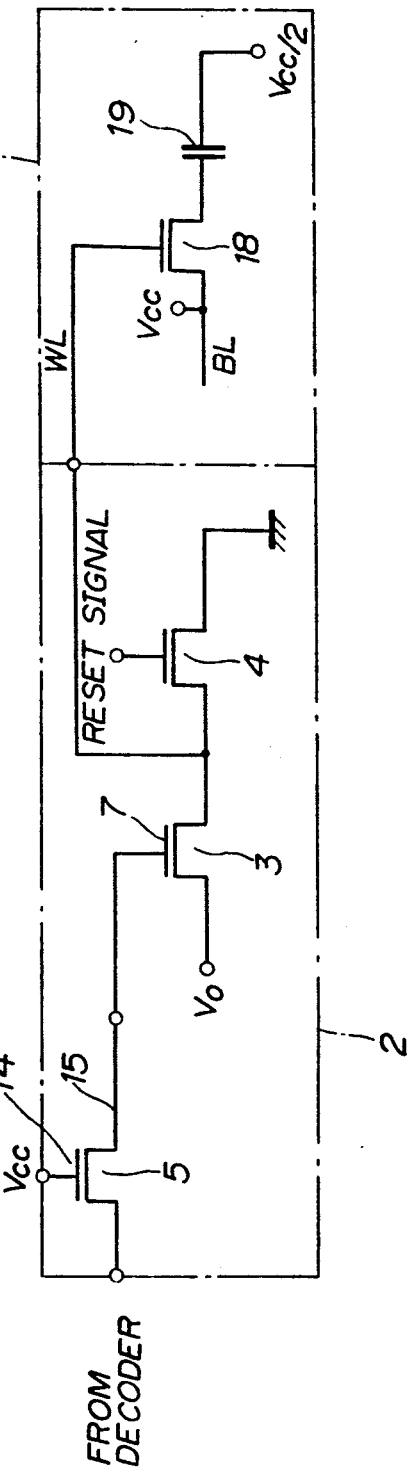

Next, a description will be given of a first embodiment of the high voltage MOS transistor according to the present invention, by referring to FIGS. 7A and 7B. FIGS. 7A and 7B respectively show the cross section and the circuit diagram of the first embodiment of the high voltage MOS transistor.

A p-type semiconductor substrate 1 made of Si or the like has a plurality of elements including n-type MOS (nMOS) transistors formed thereon. A bootstrap word line driver circuit 2 for applying a voltage to a word line WL includes three nMOS transistors 3, 4 and 5. The first and second MOS transistors 3 and 4 are connected in series, and the drain layer 15 of the third MOS transistor 5 is connected to a gate electrode 7 of the first MOS transistor 3.

The first MOS transistor 3 includes the gate electrode 7 which is formed on the semiconductor substrate 1 via a gate oxide layer 6, and source and drain layers 8 and 9 which have an LDD structure including $n^+$ and $n^-$ regions and are formed on respective sides of the gate electrode 7.

The second MOS transistor 4 includes a gate electrode 11 which is formed on the semiconductor substrate 1 via a gate oxide layer 10, and source and drain layers 12 and 113 which have an LDD structure including $n^+$ and $n^-$ regions and are formed on respective sides of the gate electrode 11. The drain layer 113 is provided integrally to the source layer 9 of the first MOS transistor 3, and thus, the first and second MOS transistors 3 and 4 are connected in series.

The third MOS transistor 5 includes a gate electrode 14 formed on the semiconductor substrate 1 via a gate oxide layer 13, an $n^{--}$-type diffusion layer 15 formed on one side of the gate electrode 14, and a diffusion layer 16 having an LDD structure formed on the other side of the gate electrode 14. The $n^{--}$-type diffusion layer 15 is connected to the gate electrode 7 of the first MOS transistor 3 via an interconnection electrode (not shown).

A fourth MOS transistor 18 forms a stacked capacitor type DRAM cell 17. Similarly to the three MOS transistors 3 through 5, the fourth MOS transistor 18 includes a gate electrode 21 formed on the semiconductor substrate 1 via an insulator layer 20, and n or $n^-$ type diffusion layers 22 and 23 formed on respective sides of the gate electrode 21. The diffusion layer 22 is connected to a bit line BL, and the gate electrode 21 is connected to the word line WL. A capacitor 19 of the DRAM cell 17 is formed on the diffusion layer 23 via a contact hole 34 which will be described later. The capacitor 19 has a stacked structure in which a storage electrode 24 which is made of polysilicon doped with n-type impurity ions such as phosphor (P) ions, a dielectric layer 25 made of silicon dioxide ($SiO_2$), and a confronting electrode 26 which is made of polysilicon including n-type impurity ions are successively stacked. A voltage Vcc/2 is applied to the confronting electrode 26.

An interlayer insulator layer 27 made of PSG or the like is formed on the first through fourth MOS transistors 3 through 5 and 18. Contact holes 28 through 33 are formed in the interlayer insulator layer 27 so as to expose the diffusion layers 8, 9, 15, 16 and the like. Electrodes 35 through 40 are formed to fill the contact holes 28 through 33. These electrodes 35 through 40 are made of polysilicon doped with impurities of the same impurity type as the source layers 9 and 12 and the drain layers 8 and 13. In addition, an electrode 41 is similarly formed on the diffusion layer 22 of the fourth MOS transistor 18.

A field oxide layer 42 is formed around the periphery of the first through third MOS transistors 3 through 5 and in the periphery of the DRAM cell 17 by a selective oxidation such as local oxidation of silicon (LOCOS).

In this embodiment, the power source voltage Vcc is first applied to the gate electrode 14 of the third MOS transistor 5 when writing data into the DRAM cell 17. When an output signal of a decoder (not shown) is input to the $n^+$-type diffusion layer 16 of the third MOS transistor 5, the potential of this $n^+$-type diffusion layer 16 becomes Vcc. Accordingly, the potential of the $n^{--}$-type diffusion layer 15 becomes Vcc-Vth, where Vth denotes the gate threshold voltage. As a result, the first MOS transistor 3 turns ON, the third MOS transistor 5 turns OFF, and the $n^{--}$-type diffusion layer 15 is raised to a voltage higher than the boost voltage Vo due to the capacitance coupling of the first MOS transistor 3. Therefore, the boost voltage Vo is applied to the drain layer 9 of the first MOS transistor 3 and to the word line WL without a voltage drop.

Hence, the boost voltage Vo is applied to the gate electrode 21 of the fourth MOS transistor 18 via the word line WL. The fourth MOS transistor 18 which is selected by a bit selection signal from the bit line BL turns ON, and a charge is stored in the capacitor 19 which is connected to the fourth MOS transistor 18. In this case, the data is written in the DRAM cell 17.

When the boost voltage Vo which is higher than the power source voltage Vcc is applied to the drain layer 8 of the first MOS transistor 3, the potential at the gate electrode 7 of the first MOS transistor 3 is raised by the capacitance coupling to a voltage which is approximately two times the boost voltage Vo. For this reason, the double-boosted voltage is also applied to the $n^{--}$-type diffusion layer 15 of the third MOS transistor 5. However, since the $n^{--}$-type diffusion layer 15 of the third MOS transistor 5 has the relatively low impurity concentration, the withstand voltage is high with respect to the semiconductor substrate 1.

In addition, the $n^{--}$-type diffusion layer 15 is made up solely of the layer having the relatively low impurity concentration, and does not have a layer having the relatively high impurity concentration. Hence, the area occupied by the element (third MOS transistor 5) does not become large. Furthermore, the electrode 38 formed on the $n^{--}$-type diffusion layer 15 is made of the polysilicon which includes the impurities of the same impurity type as the $n^{--}$-type diffusion layer 15. For this reason, it is possible to carry out an annealing to diffuse the impurities within the electrode 38 into the shallow portion of the n⁻-type diffusion layer 15 and reduce the contact resistance.

Figure 8:
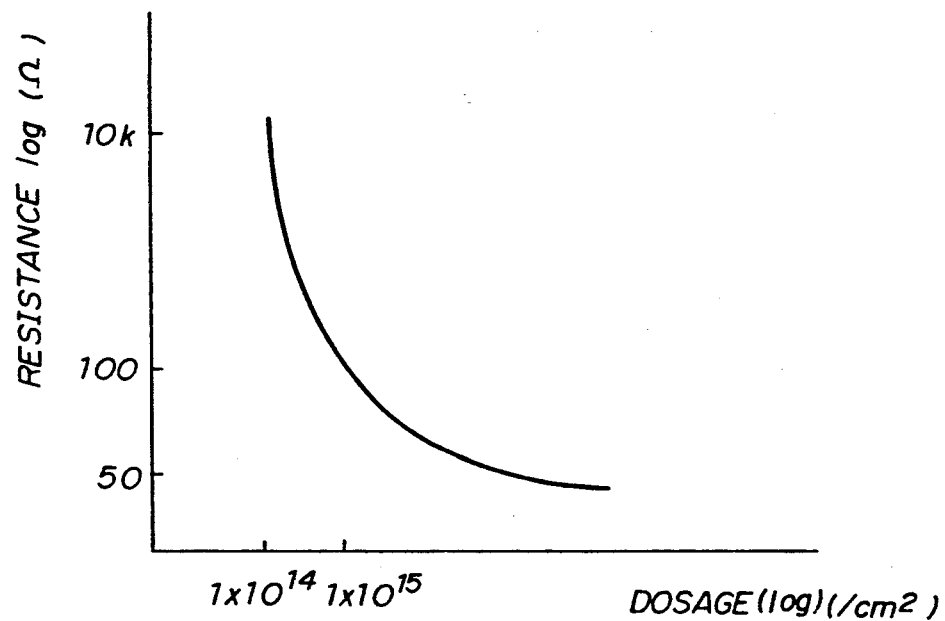
FIG. 8 is a diagram showing a relationship of an impurity dosage of polysilicon and a contact resistance between an electrode and an n⁻-type diffusion layer.

FIG. 8 shows the relationship of the impurity dosage of the polysilicon and the contact resistance between the electrode 38 and the n⁻-type diffusion layer 15. In FIG. 8, the ordinate indicates the resistance in log scale, and the abscissa indicates the impurity dosage in log scale. The relationship shown in FIG. 8 is obtained for a case where the polysilicon electrode 38 has a thickness of 2000 Å A and the impurity dosage of the n⁻-type diffusion layer 15 is $1 \times 10^{13}/cm^2$. It may be seen from FIG. 8 that the contact resistance is extremely small when the impurity dosage of the polysilicon is $1 \times 10^{15}/cm^2$ or greater.

Figure 9:
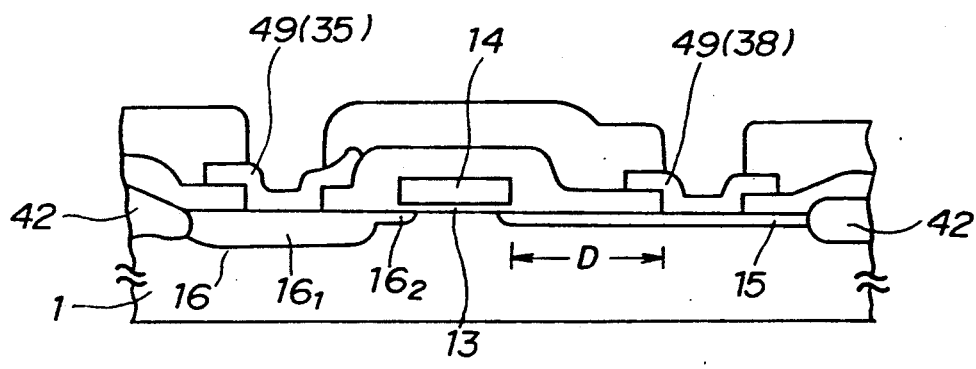
FIG. 9 is a cross-sectional view of a first embodiment of the high voltage MOS transistor according to the present invention.
Figure 10:
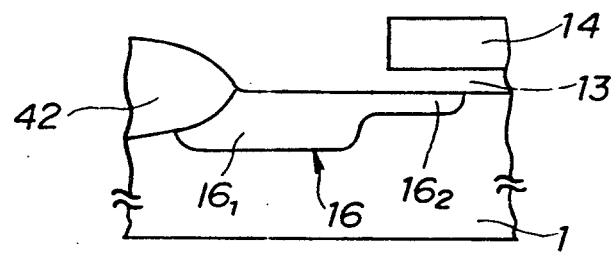
FIG. 10 is a cross-sectional view of an essential part of the first embodiment of the high voltage MOS transistor on an enlarged scale.

FIGS. 9 and 10 respectively show essential parts of the first embodiment of the high voltage MOS transistor. In this embodiment, the n⁺-type diffusion layer 16 has the LDD structure as shown in FIG. 9 and includes an n⁺-type portion $16_1$ and an n⁻-type portion $16_2$. The impurity concentration of the n⁺-type portion $16_1$ is greater than that of the n⁻-type portion $16_2$, and the impurity concentration of the n⁻-type portion $16_2$ is approximately the same as that of the n⁻-type diffusion layer 15. In addition, as shown in FIG. 10, the n⁻-type portion $16_2$ partially overlaps the gate electrode 14.

Under the condition that the dosage of P ions for the n⁻-type diffusion layer 15 is $1 \times 10^3/cm^2$, the polysilicon electrode 38 has a thickness of 2000 Å, the dosage of P ions for the polysilicon is $1 \times 10^{15}/cm^2$ and a distance D between the gate electrode 14 and the contact hole 29 shown in FIG. 9 is 1 μm, it was confirmed that a withstand voltage of 20 V is obtainable at the drain.

Next, a description will be given of embodiments of a method of producing a semiconductor device which has the drain layer 15 with the relatively low impurity concentration and the source layer 16 with the relatively high impurity concentration, by taking the method of forming the first and third MOS transistors 3 and 5 as an example.

Figure 11A:
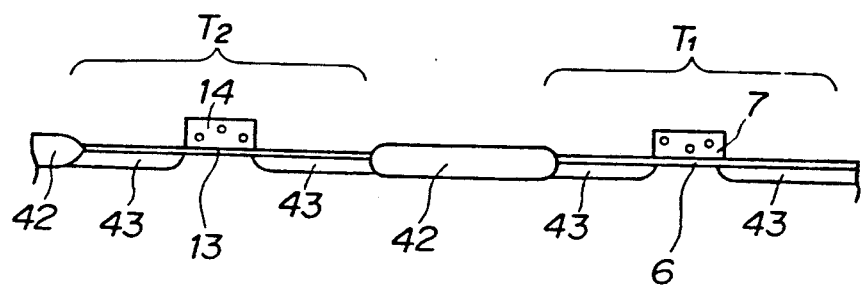
FIGS. 11A, 11B, 11C, 11D, 11E, 11F and 11G are cross-sectional views for explaining a first embodiment of a method of producing the semiconductor device according to the present invention.

First, a description will be given of a first embodiment of a method of producing a semiconductor device according to the present invention. As shown in FIG. 11A, the field oxide layer 42 is formed by a LOCOS around the peripheries of transistor forming regions $T_1$ and $T_2$ where the first and third transistors 3 and 5 are to be formed on the semiconductor substrate 1, and the gate oxide layers 6 and 13 are thereafter formed by thermal oxidation. Then, a polysilicon layer including impurities is formed and patterned by a photolithography technique, so as to form the polysilicon gate electrodes 7 and 14 via the respective gate oxide layers 6 and 13 at respective centers of the transistor forming regions $T_1$ and $T_2$.

Next, n-type impurity ions such as P ions are injected and diffused in the semiconductor substrate 1 to form n⁻-type diffusion layers 43 of relatively low impurity concentration in the self-aligned manner on both sides of the gate electrodes 7 and 14. For example, the impurity ions are injected into the semiconductor substrate 1 with a dosage of $10^{13}$ to $10^{14}/cm^2$.

Figure 11B:
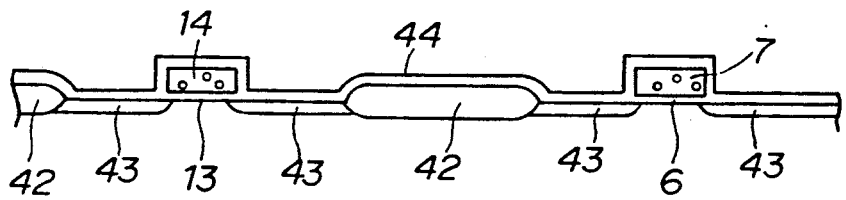
Figure 11C:
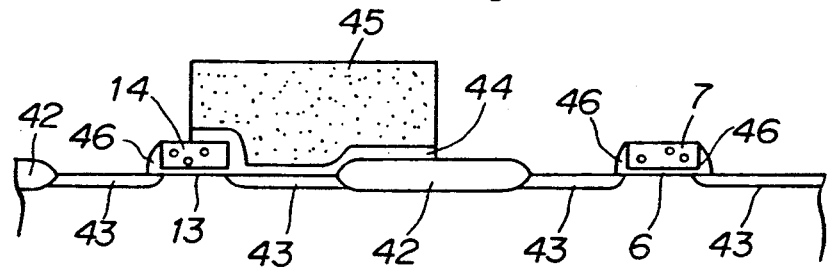

Thereafter, as shown in FIG. 11B, a SiO₂ layer 44 is formed on the entire surface to a thickness of approximately 1000 Å by a chemical vapor deposition (CVD). In addition, one of the diffusion layers 43 in the transistor forming region $T_2$ and the periphery of this one diffusion layer 43 are covered by a resist 45, and the SiO₂ is selectively removed by a reactive ion etching (RIE). Only the portions of the SiO₂ layer 44 covered by the resist 45 remains after the RIE, and sidewalls 46 of the remaining SiO₂ layer 44 are formed on the sides of the gate electrodes 7 and 14 as shown in FIG. 11C.

Figure 11D:
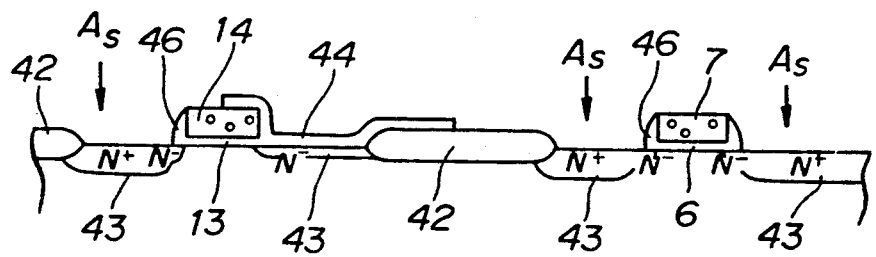

Next, the SiO₂ layer 44 and the sidewalls 46 are used as masks and arsenic (As) ions are injected and diffused in the semiconductor substrate 1. As a result, a diffusion layer of a relatively high impurity concentration of approximately $10^{20}/cm^3$ is formed in a region of the diffusion layer 43 not covered by the SiO₂ layer 44, thereby forming this diffusion layer 43 into the LDD structure as shown in FIG. 11D. On the other hand, the diffusion layer 43 covered by the SiO₂ layer 44 is maintained to the relatively low impurity concentration as shown in FIG. 11D.

Figure 11E:
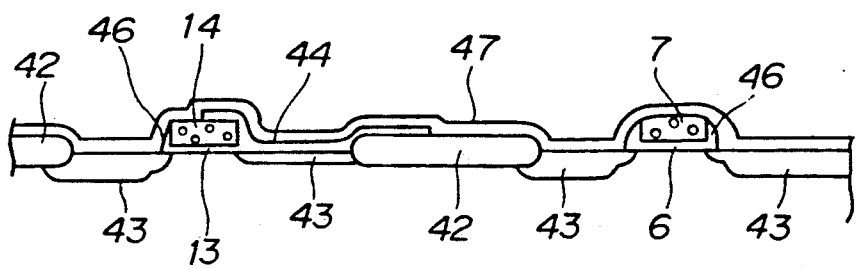
Figure 11F:
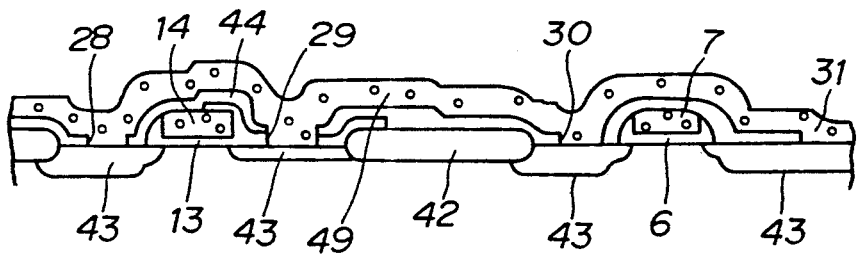

Thereafter, a SiO₂ layer 47 is formed on the entire surface as shown in FIG. 11E. A photolithography technique is used to pattern the SiO₂ layer 47 and the SiO₂ layer 44, thereby forming the contact holes 28 through 31 on the diffusion layers 43 as shown in FIG. 11F.

Figure 11G:
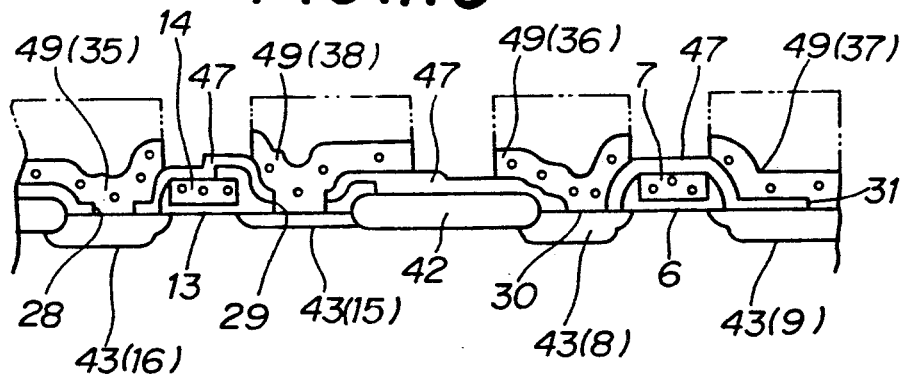

Then, a polysilicon layer 49 having a thickness of approximately 2000 Å is formed on the entire surface, and P ions are injected with a dosage of $1 \times 10^{15}/cm^2$. In addition, a photolithography technique is used to selectively etch the polysilicon layer 49, and the polysilicon layer 49 is left within the contact holes 28 through 31 as shown in FIG. 11G.

In this state, the diffusion layers 43 formed in the transistor forming region $T_1$ have the LDD structure, and one diffusion layer 43 forms the drain layer 8 shown in FIG. 7A, while the other diffusion layer 43 forms the source layer 9 shown in FIG. 7A. On the other hand, between the diffusion layers 43 formed in the transistor forming region $T_2$, the diffusion layer 43 which is covered by the SiO₂ layer 44 and has the relatively low impurity concentration is used as the n⁻-type diffusion layer 159 while the other diffusion layer 43 is used as the diffusion layer 16 having the LDD structure. Furthermore, the polysilicon layer 49 remaining within the contact holes 28 through 31 functions as the electrodes 35 through 38.

The electrodes 35 through 38 are heated in a latter thermal process such as thermal oxidation and annealing, and the impurities included in the electrodes 35 through 38 diffuse shallowly into the source layer 9, the drain layer 8 and the diffusion layers 15 and 16. As a result, the contact resistance between these layers 16, 8, 8 and 15 and the corresponding electrodes 35 through 38 is reduced.

Accordingly, even when the voltage higher than the boost voltage Vo is applied to the diffusion layer 15 of the third MOS transistor 5 which is an n⁻-type layer, the contact resistance between the electrode 38 and the diffusion layer 15 is reduced and a satisfactory contact is obtained.

When covering the n⁻-type diffusion layer 15 of the third MOS transistor 5 by the SiO₂ layer 44, a stepped portion with a vertical edge is formed by the SiO₂ layer 44 remaining on the semiconductor substrate 1 after the resist 45 is used as the mask to pattern the SiO₂ layer 44. For this reason, when the SiO₂ layer 44 is thick, there are problems in that the stepped portion may cause damage to an interconnection layer which is formed at a latter stage and etching residue may be generated during a process.

Next, a description will be given of a second embodiment of the method of producing the semiconductor device according to the present invention, by referring to FIGS. 12A through 12D. According to this embodiment, the above described problems of the first embodiment of the method of producing the semiconductor device are eliminated.

Figure 12A:
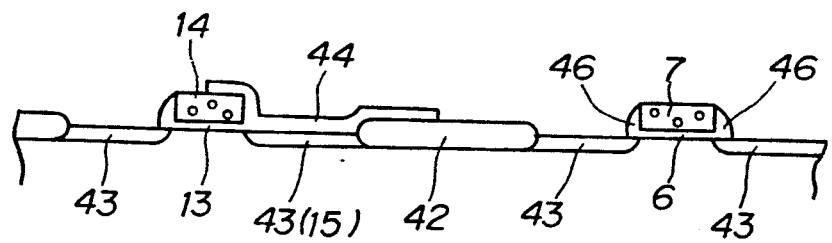
FIGS. 12A, 12B, 12C and 12D are cross-sectional views for explaining a second embodiment of the method of producing the semiconductor device according to the present invention.
Figure 12B:
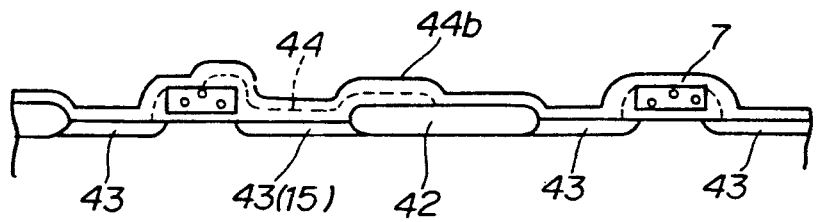
Figure 12C:
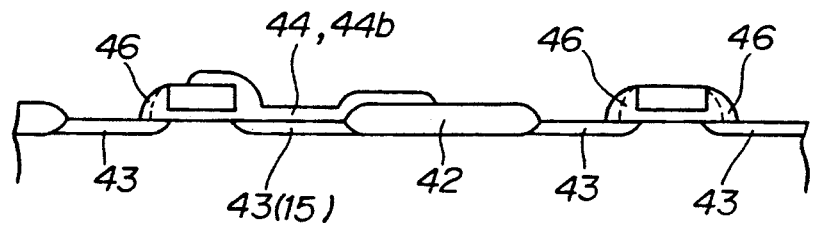

FIG. 12A shows a state where the resist 45 is removed from the state shown in FIG. 11C. Then, as shown in FIG. 12B, a second SiO$_2$ layer 44b is formed on the entire surface to a thickness of approximately 1000 Å and etched by a RIE. As a result, the side edge portion of the SiO$_2$ layer 44 remaining on the n$^-$-type diffusion (source) layer 15 becomes smooth as shown in FIG. 12C and the step coverage is improved. In this case, the sidewalls 46 on both sides of the gate electrodes 7 and 14 have the two-layer structure. However, the thickness of the sidewall 46 can easily be controlled by appropriately adjusting the thicknesses of the first and second SiO$_2$ layers 44 and 44b.

Figure 12D:
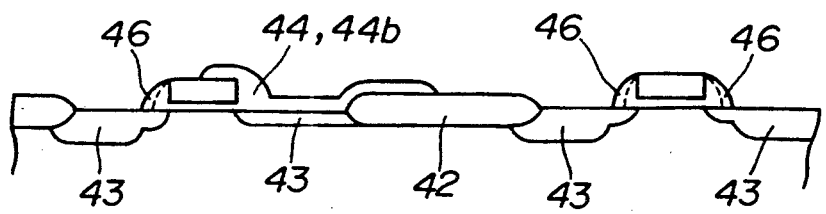

Thereafter, impurity ions are injected and diffused in the semiconductor substrate 1 using the sidewalls 46 and the two SiO$_2$ layers 44 and 44b as masks. Hence, the diffusion layers 43 having the LDD structure and the diffusion layer 43 having the relatively low impurity concentration are formed as shown in FIG. 12D, similarly to FIG. 11D.

Figure 13:
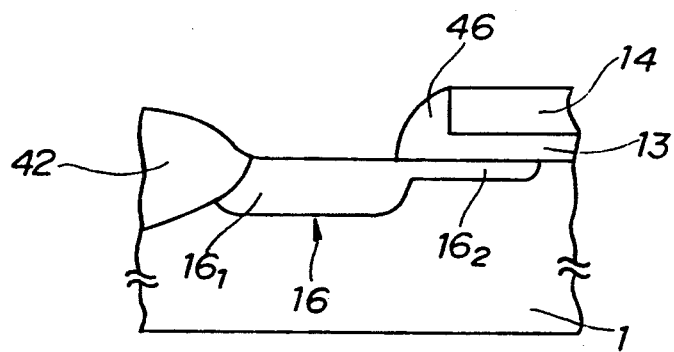
FIG. 13 is a cross-sectional view of an essential part of a second embodiment of the high voltage MOS transistor on an enlarged scale.

According to the second embodiment of the method of producing the semiconductor device, a second embodiment of the high voltage MOS transistor according to the present invention is produced. FIG. 13 shows an essential part of the second embodiment of the high voltage MOS transistor. In this embodiment of the high voltage MOS transistor, the n$^-$-type portion 16$_2$ of the n$^+$-type diffusion layer 16 is formed under the sidewall 46.

Figure 14:
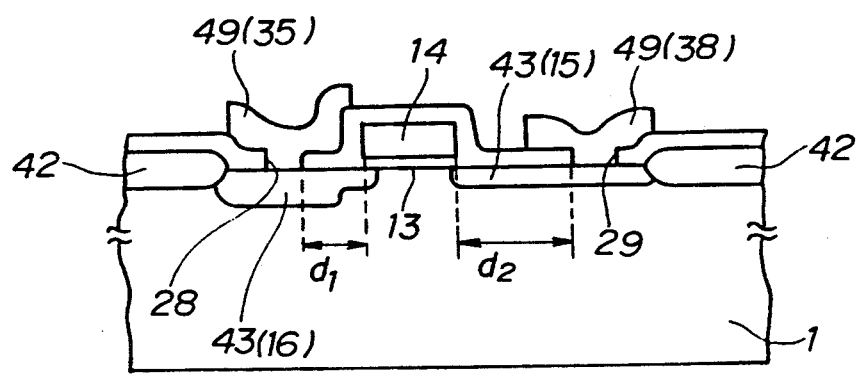
FIG. 14 is a cross-sectional view of a third embodiment of the high voltage MOS transistor according to the present invention.
Figure 15:
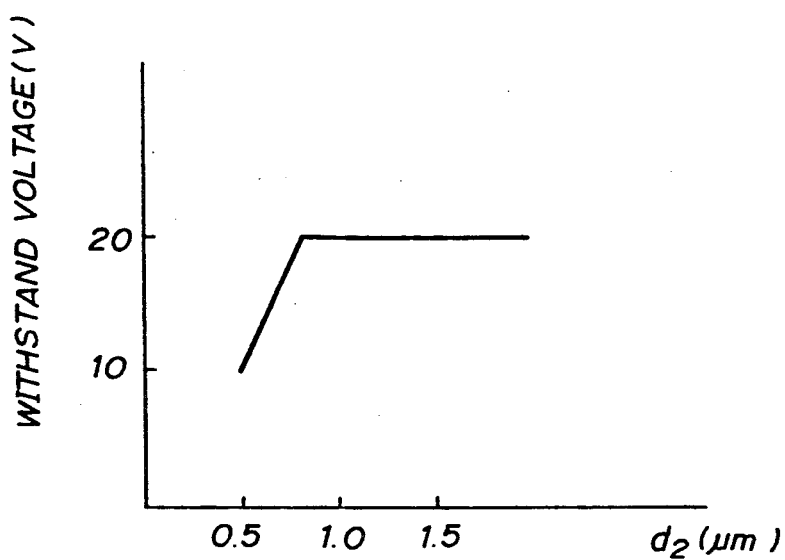
FIG. 15 is a diagram showing a relationship of a distance d2 and a withstand voltage on the side of the n⁻-type diffusion layer.

Next, a description will be given of a third embodiment of the high voltage MOS transistor according to the present invention, by referring to FIG. 14. In FIG. 14, those parts which are the same as those corresponding parts in FIG. 7A are designated by the same reference numerals, and a description thereof will be omitted. In this embodiment of the high voltage MOS transistor, a distance d$_1$ between the contact hole 28 and the gate electrode 14 is set smaller than a distance d$_2$ between the contact hole 29 and the gate electrode 14. FIG. 15 shows the relationship of the distance d$_2$ and the withstand voltage on the side of the n$^-$-type diffusion layer 15. As may be seen from FIG. 15, the withstand voltage is 20 V when the distance d$_2$ is approximately 0.8 μm or greater.

Figure 16A:
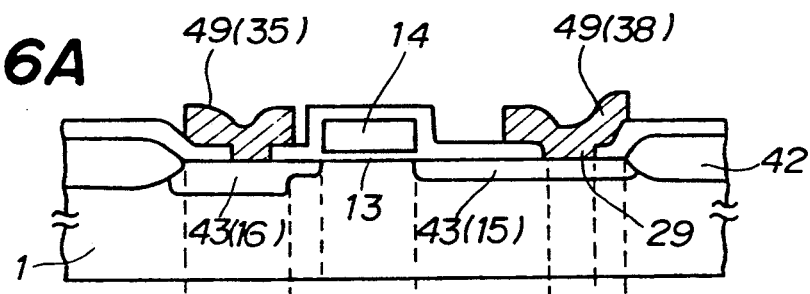
FIGS. 16A and 16B respectively are a cross-sectional view and a plan view of an essential part of a fourth embodiment of the high voltage MOS transistor according to the present invention.
Figure 16B:
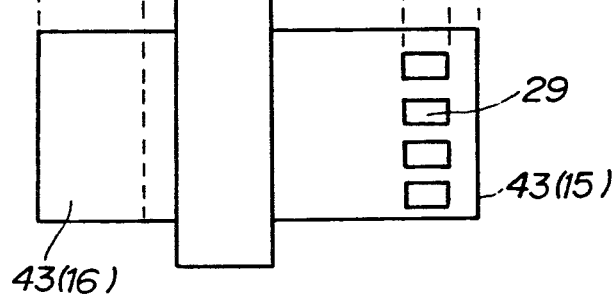
Figure 16C:
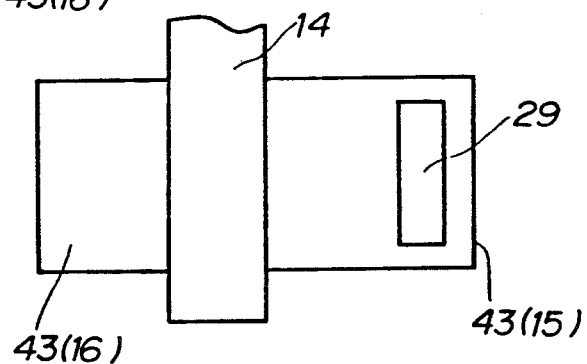
FIG. 16C is a plan view of an essential part of a fifth embodiment of the high voltage MOS transistor according to the present invention.

Next, a description will be given of fourth and fifth embodiments of the high voltage MOS transistor according to the present invention, by referring to FIGS. 16A through 16C. In FIGS. 16A through 16C, those parts which are the same as those corresponding parts in FIG. 7A are designated by the same reference numerals, and a description thereof will be omitted. FIG. 16A shows a cross section of the fourth and fifth embodiments, and FIGS. 16B and 16C respectively show plan views of the fourth and fifth embodiments. As shown in FIG. 16B, the contact hole 29 is made up of a plurality of holes in the fourth embodiment. On the other hand, as shown in FIG. 16C, the contact hole 29 is made of a single hole which is large compared to those of the fourth embodiment. Hence, the contact area of the fifth embodiment is improved compared to that of the fourth embodiment.

Figure 17:
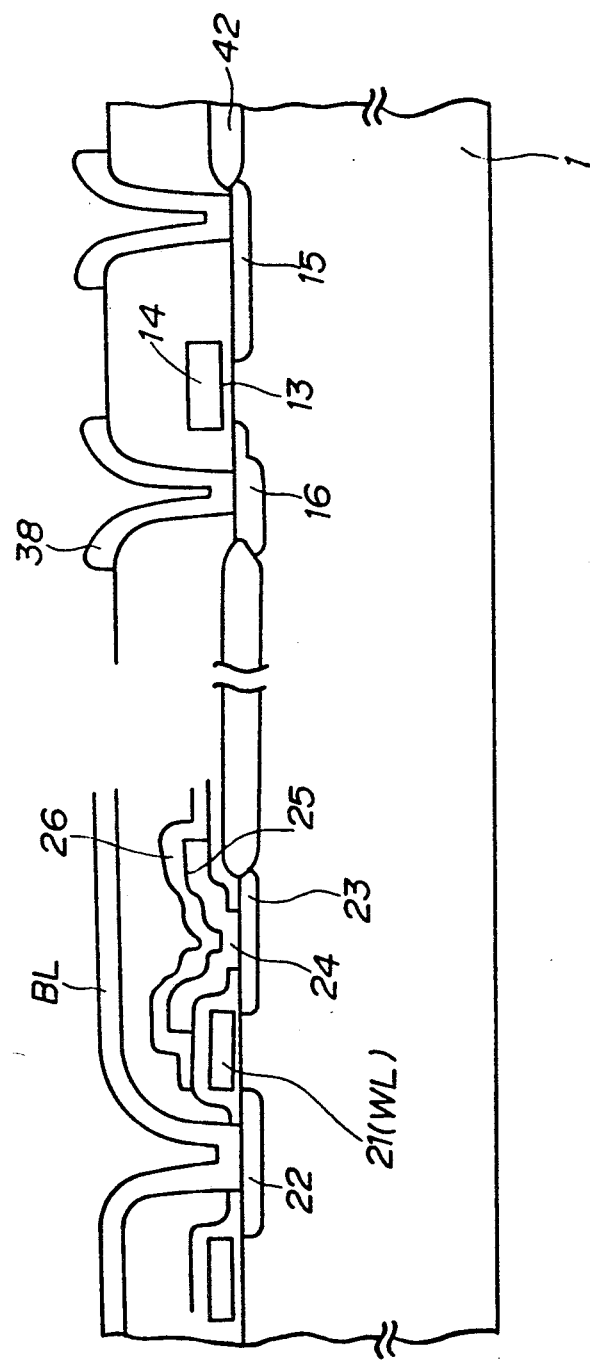
FIG. 17 is a cross-sectional view of an essential part of a second embodiment of the semiconductor device according to the present invention.

When forming the electrode 38 and the like by a polysilicon layer, it is possible to simplify the production process as a whole if the polysilicon layer can be formed by a process which is common to the process of forming a conductor layer of the semiconductor device. Hence, in a second embodiment of the semiconductor device according to the present invention, the polysilicon layer which forms the electrode 38 is also used as a conductor layer within the DRAM. FIG. 17 shows an essential part of the second embodiment of the semiconductor device. In FIG. 17, those parts which are the same as those corresponding parts in FIG. 7A are designated by the same reference numerals, and a description thereof will be omitted. For example, the storage electrode 24 of the DRAM may be formed by the same polysilicon layer which forms the electrode 38. As another example, the bit line BL of the DRAM may be formed by the same polysilicon layer which forms the electrode 38.

Figure 18A:
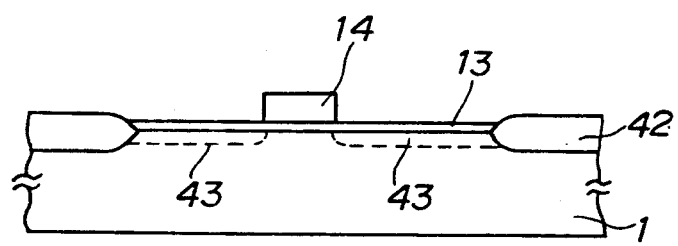
FIGS. 18A and 18B are cross-sectional views for explaining a first embodiment of a method of producing the high voltage MOS transistor according to the present invention.
Figure 18B:
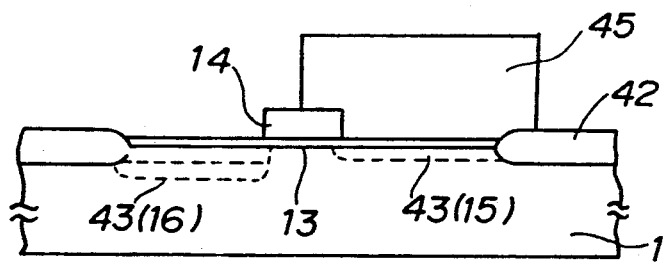

Next, a description will be given of a first embodiment of a method of producing a high voltage MOS transistor according to the present invention, by referring to FIGS. 18A and 18B. In FIGS. 18A and 18B, those parts which are the same as those corresponding parts in FIGS. 11A through 11G are designated by the same reference numerals, and a description thereof will be omitted.

In this embodiment, the field oxide layer 42 is formed by a LOCOS as shown in FIG. 18A, similarly as described before in conjunction with FIG. 11A. In addition, the gate oxide layer 13 is formed by a thermal oxidation, and a polysilicon layer is formed and patterned to form the gate electrode 14. Further, an ion implantation is carried out to form the diffusion layers 43 having the relatively low impurity concentration.

Thereafter, as shown in FIG. 18B, the resist 45 is formed on the diffusion layer 43 to which the high voltage is applied, similarly as described before in conjunction with FIG. 11C. An ion implantation is carried out using the field oxide layer 42, the gate electrode 14 and the resist 45 as masks, so as to form the diffusion layer 43 (source layer 16) having the LDD structure.

The formation of the interlayer insulator layer, the contact holes and the electrodes may be carried out in a manner similar to that described before in conjunction with FIGS. 11D through 11G, and a description thereof will be omitted.

Figure 19:
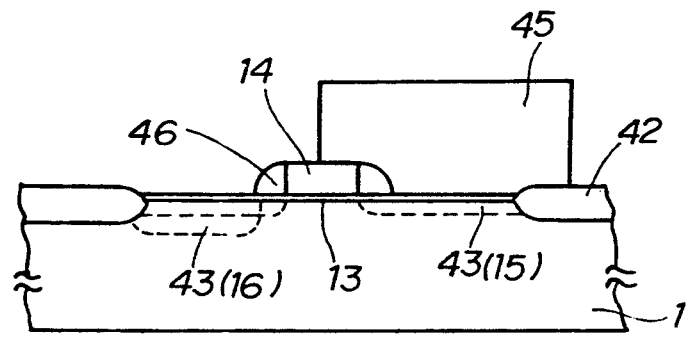
FIG. 19 is a cross-sectional view for explaining a second embodiment of the method of producing the high voltage MOS transistor according to the present invention.

Next, a description will be given of a second embodiment of the method of producing the high voltage MOS transistor according to the present invention, by referring to FIG. 19. In FIG. 19, those parts which are the same as those corresponding parts in FIGS. 11A through 11G are designated by the same reference numerals, and a description thereof will be omitted.

In this embodiment, the SiO$_2$ oxide layer 44 is formed on the entire surface of the structure shown in FIG. 18A and the SiO$_2$ oxide layer 44 is etched by a RIE to form the sidewalls on the side surfaces of the gate electrode 14 as shown in FIG. 19. Furthermore, the resist 45 is formed on the diffusion layer 43 to which the high voltage is applied. An ion implantation is carried out using the field oxide layer 42, the sidewalls 46, the gate electrode 14 and the resist 45 as masks, so as to form the diffusion layer 43 (source layer 16) having the LDD structure.

Figure 20:
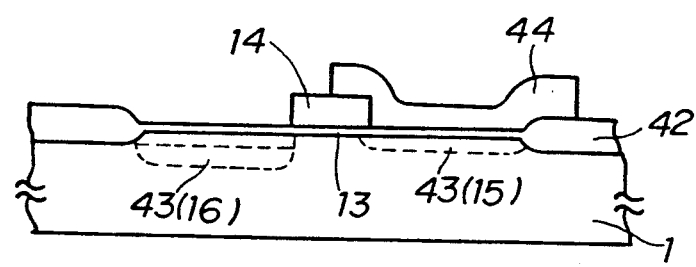
FIG. 20 is a cross-sectional view for explaining a third embodiment of the method of producing the high voltage MOS transistor according to the present invention.

Next, a description will be given of a third embodiment of the method of producing the high voltage MOS transistor according to the present invention, by referring to FIG. 20. In FIG. 20, those parts which are the same as those corresponding parts in FIGS. 11A through 11G are designated by the same reference numerals, and a description thereof will be omitted.

In this embodiment, the SiO₂ oxide layer 44 is used as a part of the mask in place of the resist 45 shown in FIG. 18B when forming the diffusion layer 43 (drain layer 16) having the LDD structure.

Figure 21:
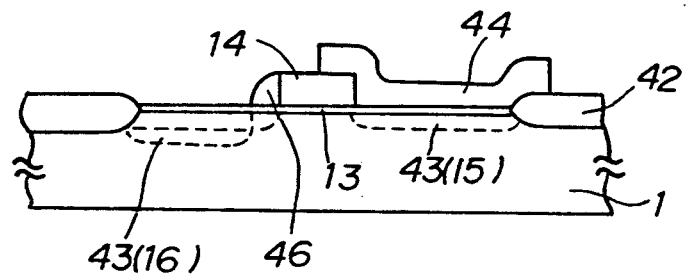
FIG. 21 is a cross-sectional view for explaining a fourth embodiment of the method of producing the high voltage MOS transistor according to the present invention.

Next, a description will be given of a fourth embodiment of the method of producing the high voltage MOS transistor according to the present invention, by referring to FIG. 21. In FIG. 21, those parts which are the same as those corresponding parts in FIGS. 11A through 11G are designated by the same reference numerals, and a description thereof will be omitted.

In this embodiment, the sidewalls 46 are formed on the side surface of the gate electrode 14 when etching the SiO₂ layer 44 shown in FIG. 20 by the RIE. Accordingly, when forming the diffusion layer 43 (source layer 16) having the LDD structure, the sidewall 46 is also used as a part of the mask.

Figure 22A:
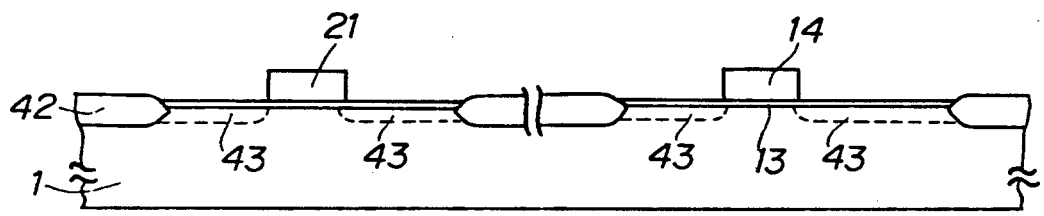
FIGS. 22A and 22B are cross-sectional views for explaining a third embodiment of the method of producing the semiconductor device according to the present invention.
Figure 22B:
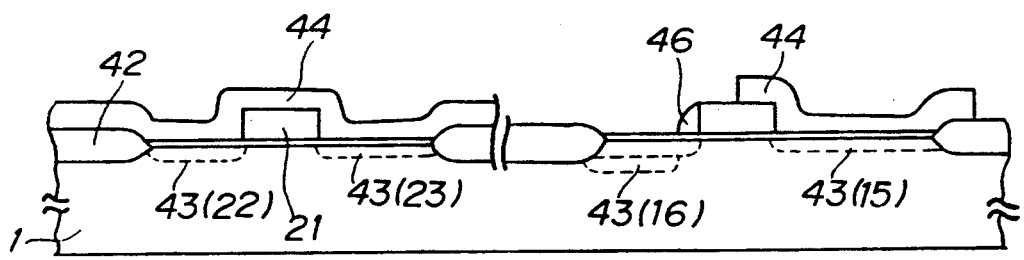

Next, a description will be given of a third embodiment of the method of producing the semiconductor device according to the present invention, by referring to FIGS. 22A and 22B. In FIGS. 22A and 22B, those parts which are the same as those corresponding parts in FIGS. 7A and 11A through 11G are designated by the same reference numerals, and a description thereof will be omitted.

In this embodiment, the SiO₂ oxide layer 44 is formed on the entire surface after the gate electrode 14 of the high voltage MOS transistor 5 and the gate electrode 21 of the MOS transistor 18 of the DRAM cell 17 are formed as shown in FIG. 22A. A photolithography technique is used to leave the SiO₂ oxide layer 44 on the MOS transistor 18 which forms the memory cell and on the diffusion layer 43 (drain layer 15) of the high voltage MOS transistor 15 as shown in FIG. 22B. As shown in FIG. 22B, the remaining SiO₂ oxide layer 44 is used as a mask when carrying out an ion implantation to form the diffusion layer 43 (source layer 16) which has the LDD structure. The sidewall 46 which remains on the side surface of the gate electrode 14 when the SiO₂ oxide layer 44 is etched by a RIE is also used as a part of the mask, similarly as in the case described before in conjunction with FIG. 21.

Figure 23A:
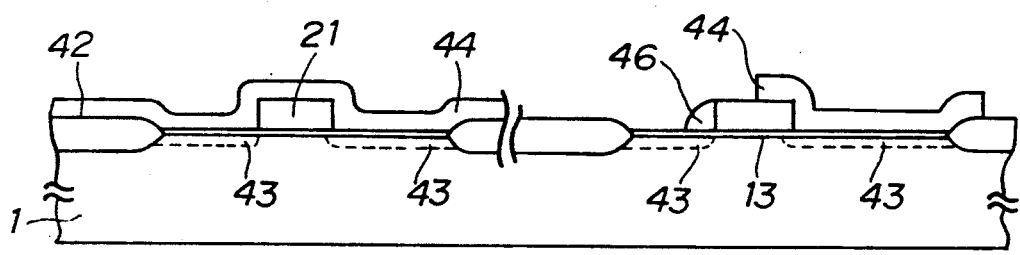
FIGS. 23A and 23B are cross-sectional views for explaining a fourth embodiment of the method of producing the semiconductor device according to the present invention.
Figure 23B:
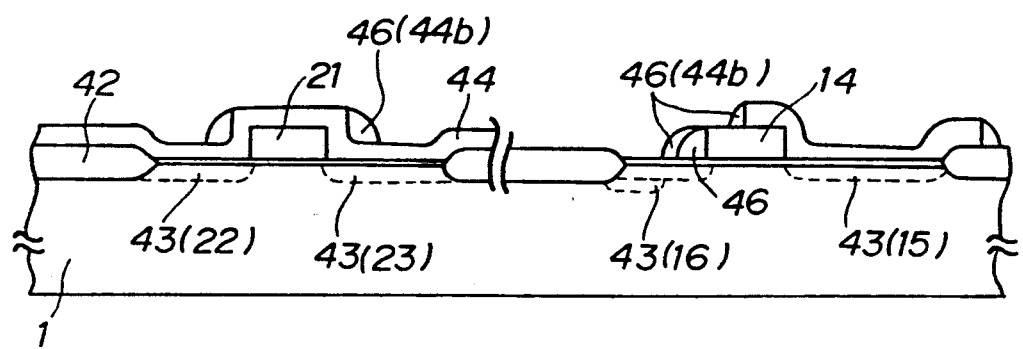

Next, a description will be given of a fourth embodiment of the method of producing the semiconductor device according to the present invention, by referring to FIGS. 23A and 23B. In FIGS. 23A and 23B, those parts which are the same as those corresponding parts in FIGS. 7A and 12A through 12D are designated by the same reference numerals, and a description thereof will be omitted.

In this embodiment, the SiO₂ layer 44b is formed after the SiO₂ oxide layer 44 is etched by a RIE, and the SiO₂ layer 44b is etched by a RIE as shown in FIG. 23A. As a result, the side edge portions of the SiO₂ oxide layer 44 remaining on the diffusion layer 43 (source layer 16) and the gate electrode 14 become smooth and both sides of the gate electrode 21 become smooth as shown in FIG. 23B. For this reason, it is possible to prevent damage to an interconnection layer which is formed at a latter stage and also prevent etching residue from being generated during a process.

The etching of the oxide layer increases the junction leak due to contamination and surface damage, because the substrate surface is directly etched. Hence, in the memory cell part of the DRAM where even the extremely small leak current causes characteristic deterioration, it is desirable not to etch the oxide layer. In the third and fourth embodiments of the method of producing the semiconductor device, a process is required to cover the memory cell part by the resist when etching the SiO₂ oxide layer 44. However, at the same time, the diffusion layer 43 (drain layer 15) of the high voltage MOS transistor 5 is also covered by the resist. Hence, there is no need to increase the number of processes exclusively for the protection of the memory cell part. The diffusion layers 22 and 23 of the memory cell part have a relatively low impurity concentration which is approximately the same as that of the diffusion layer 43 (drain layer 15). But since ion implantation with a high impurity dosage induces crystal defect and junction leak, no problems are caused by the relatively low impurity concentration of the diffusion layers 22 and 23.

In each of the embodiments described heretofore, the electrode which is formed on the diffusion layer having the relatively low impurity concentration is made of polysilicon. However, it is possible to use amorphous silicon or refractory metal silicide in place of polysilicon. For example, the refractory metal included in the refractory metal silicide may be tungsten (W), molybdenum (Mo), tantalum (Ta), titanium (Ti) and the like. In addition, it is possible to use a polycide layer on the diffusion layer as the electrode. In this case, the polycide layer includes a refractory metal silicide such as tungsten silicide on a polysilicon layer. Moreover, it is possible to form an Al interconnection layer on the electrode which is made of polysilicon or polycide, and "AL" in FIG. 5 shows such an Al interconnection layer. For example, the polycide layer is formed by forming a refractory metal layer of approximately 0.1 $\mu$m on a polysilicon layer of approximately 0.1 $\mu$m, and P ions are injected into the refractory metal layer with a dosage of approximately $10^{15}$/cm².

Further, the present invention is not limited to these embodiments, but various variations and modifications may be made without departing from the scope of the present invention.

What is claimed is:

1. A high voltage MOS transistor comprising:
   a semiconductor substrate of a first semiconductor type;
   a gate oxide layer on said semiconductor substrate;
   a gate electrode formed on said gate oxide layer and having first and second sides;
   first and second diffusion regions formed in said semiconductor substrate on the first and second sides of said gate electrode and being of a second semiconductor type opposite to said first semiconductor type, said first diffusion region having an impurity concentration; and
   an electrode directly connected to said first diffusion region and made up of a conductor layer including polysilicon,
   said conductor layer having an impurity concentration which is higher than the impurity concentration of said first diffusion region.

2. The high voltage MOS transistor as claimed in claim 1, wherein said semiconductor substrate has a surface portion, wherein said second diffusion region has a lightly doped drain structure including a first region which is formed at the surface portion of said semiconductor substrate and which has an impurity concentration substantially equal to that of said first diffusion region, and a second region which connects to said first region and which has an impurity concentration higher than that of said first diffusion region.

3. The high voltage MOS transistor as claimed in claim 2, wherein said gate electrode has a side surface, further comprising a sidewall on at least said first region and on the side surface of said gate electrode.

4. The high voltage MOS transistor as claimed in claim 2, wherein said first region overlaps a part of said gate oxide layer under said gate electrode.

5. The high voltage MOS transistor as claimed in claim 1, wherein a depth of solid phase diffusion of impurities from said conductor layer into said first diffusion region is less than a depth of said first diffusion region.

6. The high voltage MOS transistor as claimed in claim 1, wherein said conductor layer includes refractory metal silicide.

7. The high voltage MOS transistor as claimed in claim 6, wherein the refractory metal silicide includes a refractory metal selected from a group consisting of tungsten (W), molybdenum (Mo), tantalum (Ta) and titanium (Ti).

8. The high voltage MOS transistor as claimed in claim 1, further comprising an insulator layer which covers said first and second diffusion regions and said gate electrode, wherein a first contact hole is formed in said insulator layer to expose said first diffusion region, wherein a second contact hole is formed in said insulator layer to expose said second diffusion region, and wherein a first distance between said gate electrode and said first contact hole is greater than a second distance between said gate electrode and said second contact hole.

9. The high voltage MOS transistor as claimed in claim 1, wherein said first semiconductor type is a p-type and said second semiconductor type is an n-type.

10. A semiconductor device having first and second voltages applied thereto, comprising:
a semiconductor substrate of a first semiconductor type; and
a high voltage MOS transistor formed on said semiconductor substrate, said high voltage MOS transistor including:
a gate oxide layer on said semiconductor substrate;
a gate electrode formed on said gate oxide layer and having first and second sides;
first and second diffusion regions of a second semiconductor type opposite to said first semiconductor type, formed in said semiconductor substrate on the first and second sides of said gate electrode;
a first electrode formed on said first diffusion region; and
a second electrode formed on said second diffusion region,
said first diffusion region having an impurity concentration lower than that of said second diffusion region,
said first electrode being made of a conductor layer including polysilicon with an impurity concentration higher than the impurity concentration of said first diffusion region,
the first voltage applied to said first electrode being greater than the second voltage applied to said second electrode.

11. The semiconductor device as claimed in claim 10, further comprising a plurality of elements formed on said semiconductor substrate, said conductor layer including the polysilicon also forming a conductor layer of at least one of said elements.

12. The semiconductor device as claimed in claim 10, further comprising a plurality of elements formed on said semiconductor substrate, said conductor layer including the polysilicon also forming an interconnection layer which connects to at least one of said elements.

13. The semiconductor device as claimed in claim 10, wherein said semiconductor device is coupled to a third voltage and a power source voltage, further comprising a plurality of elements formed on said semiconductor substrate, said elements including a MOS transistor having one of source and drain electrodes coupled to the third voltage which is higher than the power source voltage, said MOS transistor having a gate electrode which is connected to said first electrode of the high voltage MOS transistor.

14. The semiconductor device as claimed in claim 13, wherein a fourth voltage is applied to a node which connects said first electrode of said high voltage MOS transistor and said gate electrode of the MOS transistor, and wherein the fourth voltage is higher than the third voltage which is applied to said one of the source and drain electrodes of the MOS transistor.

15. The semiconductor device as claimed in claim 13, wherein said semiconductor device includes a word line, wherein said elements include a memory cell which is connected to said word line, and wherein said other of said source and drain electrodes of said MOS transistor is connected to said word line.

16. The semiconductor device as claimed in claim 15, wherein said memory cell includes one MOS transistor and one capacitor connected thereto.

17. The semiconductor device as claimed in claim 10, wherein said semiconductor substrate has a surface portion, wherein said second diffusion region has a lightly doped drain structure including a first region which is formed at the surface portion of said semiconductor substrate and which has an impurity concentration substantially equal to that of said first diffusion region, and a second region which connects to said first region and which has an impurity concentration higher than that of said first diffusion region.

18. The semiconductor device as claimed in claim 17, wherein said gate electrode has a side surface, further comprising a sidewall on at least said first region and on the side surface of said gate electrode.

19. The semiconductor device as claimed in claim 17, wherein said first region overlaps a part of said gate oxide layer under said gate electrode.

20. The semiconductor device as claimed in claim 10, wherein a depth of solid phase diffusion of impurities from said conductor layer into said first diffusion region is less than a depth of said first diffusion region.

21. The semiconductor device as claimed in claim 10, wherein said conductor layer includes refractory metal silicide.

22. The semiconductor device as claimed in claim 21, wherein the refractory metal silicide includes a refractory metal selected from a group consisting of tungsten (W), molybdenum (Mo), tantalum (Ta) and titanium (Ti).

23. The semiconductor device as claimed in claim 10, further comprising an insulator layer which covers said first and second diffusion regions and said gate electrode, wherein a first contact hole is formed in said insulator layer to expose said first diffusion region, wherein a second contact hole is formed in said insulator layer to expose said second diffusion region, and wherein a first distance between said gate electrode and said first contact hole is greater than a second distance between said gate electrode and said second contact hole.

24. The semiconductor device having the high voltage MOS transistor as claimed in claim 10, wherein the first semiconductor type is a p-type and the second semiconductor type is an n-type.

25. A MOS transistor comprising:
a semiconductor substrate of a first semiconductor type;
an oxide layer on said semiconductor substrate;
a gate electrode on said oxide layer;
first and second doped regions in said semiconductor substrate adjacent said gate electrode, said first and second doped regions being of a second semiconductor type opposite to said first semiconductor type, said first doped region having a first impurity concentration; and
an electrode directly connected to said first doped region, said electrode being a conductor layer including polysilicon, said conductor layer having a second impurity concentration which is higher than said first impurity concentration.

26. A semiconductor device having first and second voltages applied thereto, the first voltage being greater than the second voltage, said semiconductor device comprising:
a semiconductor substrate of a first semiconductor type; and
a MOS transistor formed on said semiconductor substrate, said MOS transistor comprising:
an oxide layer on said semiconductor substrate;
a gate electrode on said oxide layer;
first and second doped regions in said semiconductor substrate adjacent said gate electrode, said first and second doped regions being of a second semiconductor type opposite to said first semiconductor type;
a first electrode on said first doped region; and
a second electrode on said second doped region, said first doped region having an impurity concentration lower than that of said second doped region, said first electrode being a conductor layer including polysilicon with an impurity concentration higher than the impurity concentration of said first doped region, the first voltage being applied to said first electrode and the second voltage being applied to said second electrode; and
a plurality of semiconductor elements on said semiconductor substrate, at least one of said plurality of semiconductor elements being partly formed by said conductor layer.

* * * * *

UNITED STATES PATENT AND TRADEMARK OFFICE
CERTIFICATE OF CORRECTION

PATENT NO. : 5,140,392
DATED : AUGUST 18, 1992
INVENTOR(S) : SHINICHIROU IKEMASU

It is certified that error appears in the above-identified patent and that said Letters Patent is hereby corrected as shown below:

Col. 2, line 30, "selfalign" should be --self-aligned--;
       line 35, "53e" should be --553e--.

Col. 3, line 8, "selfalign" should be --self-aligned--.

Col. 4, line 60, "nd" should be --and--.

Col. 6, line 63, "diffus" should be --diffuse--.

Col. 9, line 10, "2000 Å A" should be --2000 Å--.

Col. 10, line 37, "159" should be --15,--.

Signed and Sealed this

Twelfth Day of October, 1993

Attest:

BRUCE LEHMAN

Attesting Officer      Commissioner of Patents and Trademarks